US010833223B2

(12) United States Patent
Takeuchi et al.

(10) Patent No.: US 10,833,223 B2
(45) Date of Patent: Nov. 10, 2020

(54) GROUP III NITRIDE SEMICONDUCTOR LIGHT-EMITTING DEVICE AND PRODUCTION METHOD THEREFOR

(71) Applicants: TOYODA GOSEI CO., LTD., Kiyosu (JP); MEIJO UNIVERSITY, Nagoya (JP)

(72) Inventors: Tetsuya Takeuchi, Nagoya (JP); Satoshi Kamiyama, Nagoya (JP); Motoaki Iwaya, Nagoya (JP); Isamu Akasaki, Nagoya (JP); Hisanori Kojima, Nagoya (JP); Toshiki Yasuda, Nagoya (JP); Kazuyoshi Iida, Kiyosu (JP)

(73) Assignees: TOYODA GOSEI CO., LTD., Kiyosu (JP); MEIJO UNIVERSITY, Nagoya (JP)

( * ) Notice: Subject to any disclaimer, the term of this patent is extended or adjusted under 35 U.S.C. 154(b) by 0 days.

(21) Appl. No.: 16/184,821

(22) Filed: Nov. 8, 2018

(65) Prior Publication Data

US 2019/0148592 A1 May 16, 2019

(30) Foreign Application Priority Data

Nov. 10, 2017 (JP) .................. 2017-217383

(51) Int. Cl.
*H01L 33/32* (2010.01)
*H01L 33/12* (2010.01)
(Continued)

(52) U.S. Cl.
CPC ............ *H01L 33/32* (2013.01); *H01L 33/007* (2013.01); *H01L 33/0075* (2013.01);
(Continued)

(58) Field of Classification Search
CPC ....... H01L 33/32; H01L 33/06; H01L 33/145; H01L 33/14; H01L 33/12; H01L 33/42; H01L 33/10; H01L 33/0075; H01L 33/007

See application file for complete search history.

(56) References Cited

U.S. PATENT DOCUMENTS

| 6,153,894 A * | 11/2000 | Udagawa ............... B82Y 20/00 257/103 |
| 2016/0149078 A1 | 5/2016 | Takeuchi et al. |
| 2019/0172975 A1* | 6/2019 | Tamari .................... H01L 33/32 |

FOREIGN PATENT DOCUMENTS

| JP | 2001-203385 A | 7/2001 |
| JP | 2015-002324 A | 1/2015 |

OTHER PUBLICATIONS

"Relationship between lattice relaxation and electrical properties in polarization doping of graded AlGaN with high AlN mole fraction on AlGaN template", Applied Physics Express 10, 025502 (2017).

* cited by examiner

*Primary Examiner* — Vongsavanh Sengdara
(74) *Attorney, Agent, or Firm* — McGinn I. P. Law Group, PLLC.

(57) ABSTRACT

To provide a Group III nitride semiconductor light-emitting device exhibiting the improved light extraction efficiency as well as reducing the influence of polarization that a p-type conductivity portion and an n-type conductivity portion occur in the AlGaN layer caused by the Al composition variation, and a production method therefor. A first p-type contact layer is a p-type AlGaN layer. A second p-type contact layer is a p-type AlGaN layer. The Al composition in the first p-type contact layer is reduced with distance from a light-emitting layer. The Al composition in the second p-type contact layer is reduced with distance from the (Continued)

light-emitting layer. The Al composition in the second p-type contact layer is lower than that in the first p-type contact layer. The Al composition variation rate to the unit thickness in the second p-type contact layer is higher than that in the first p-type contact layer.

15 Claims, 5 Drawing Sheets

(51) Int. Cl.
H01L 33/10 (2010.01)
H01L 33/42 (2010.01)
H01L 33/14 (2010.01)
H01L 33/06 (2010.01)
H01L 33/00 (2010.01)

(52) U.S. Cl.
CPC .............. *H01L 33/06* (2013.01); *H01L 33/10* (2013.01); *H01L 33/12* (2013.01); *H01L 33/14* (2013.01); *H01L 33/145* (2013.01); *H01L 33/42* (2013.01)

United States Patent [19]

GROUP III NITRIDE SEMICONDUCTOR LIGHT-EMITTING DEVICE AND PRODUCTION METHOD THEREFOR

BACKGROUND OF THE INVENTION

Field of the Invention

The present techniques relate to a Group III nitride semiconductor light-emitting device for emitting ultraviolet light and a production method therefor.

Background Art

The semiconductor light-emitting device emits light through recombination of electrons and holes in the well layer of the light-emitting layer. In general, the concentrations of electrons and holes in the well layer are preferably increased to improve the emission efficiency.

In the Group III nitride semiconductor light-emitting device for emitting ultraviolet light, an AlGaN layer is often used. It is because a GaN layer efficiently absorbs light with a wavelength of 365 nm or less. In the AlGaN layer, an acceptor such as Mg has high ionization energy. Therefore, holes are hardly generated in the AlGaN layer with a high Al composition.

Therefore, the techniques to efficiently inject holes into the light-emitting layer of the ultraviolet light-emitting device have been developed. Patent Document 1 discloses a structure in which an active layer 103 is interposed between the first and second composition-graded AlGaN layers 102 and 104 (refer to paragraph [0016] and FIG. 1 of Patent Document 1). Thus, the holes exist in the vicinity of the active layer 103 (paragraphs [0025] to [0028] and FIG. 4 of Patent Document 1).

Patent Document 1: Japanese Patent Application Laid-Open (kokai) No. 2015-002324
Non-Patent Document 1: Applied Physics Express 10, 025502 (2017)

The present inventors found a problem that when a composition-graded AlGaN layer is formed, a p-type conductivity portion and an n-type conductivity portion occur in the AlGaN layer (FIG. 5(b) of Non-Patent Document 1). That is, polarization occurs in the AlGaN layer. As a result, the electric resistance of the light-emitting device is increased, thereby preventing current from flowing in the light-emitting device.

The AlGaN layer in a region with a low Al composition absorbs, to some extent, light with a wavelength of 365 nm or less. Therefore, improvement of the light extraction efficiency needs to be studied considering light absorption.

SUMMARY OF THE INVENTION

The present techniques have been conceived for solving the aforementioned problems involved in conventional techniques. Thus, an object of the present techniques is to provide a Group III nitride semiconductor light-emitting device exhibiting the improved light extraction efficiency as well as reducing the influence of polarization that a p-type conductivity portion and an n-type conductivity portion occur in the AlGaN layer caused by the Al composition variation, and a production method therefor.

In a first aspect of the present techniques, there is provided a Group III nitride semiconductor light-emitting device including a substrate, an n-type semiconductor layer on the substrate, a light-emitting layer on the n-type semiconductor layer, and a p-type semiconductor layer on the light-emitting layer. The Group III nitride semiconductor light-emitting device has an emission wavelength of 380 nm or less. The p-type semiconductor layer has a first p-type contact layer and a second p-type contact layer. The first p-type contact layer is disposed between the second p-type contact layer and the light-emitting layer. The first p-type contact layer is a p-type AlGaN layer. The second p-type contact layer is a p-type AlGaN layer. The Al composition in the first p-type contact layer is reduced with distance from the light-emitting layer. The Al composition in the second p-type contact layer is reduced with distance from the light-emitting layer. The Al composition in the second p-type contact layer is lower than the Al composition in the first p-type contact layer. The Al composition variation rate to the unit thickness in the second p-type contact layer is larger than that in the first p-type contact layer.

The Group III nitride semiconductor light-emitting device has two layers of the first p-type contact layer and the second p-type contact layer. The Al compositions in the first p-type contact layer and the second p-type contact layer are reduced with distance from the light-emitting layer. Thereby, the hole concentration increases. The thickness of the second p-type contact layer is smaller than the thickness of the first p-type contact layer. The Al composition variation rate to the unit thickness in the second p-type contact layer is steeper than the Al composition variation rate to the unit thickness in the first p-type contact layer. Therefore, the n-type conductivity portion can be reduced as small as possible in the p-type contact layer. That is, the influence of polarization caused by the Al composition-graded layer with a monotonously decreasing Al composition can be eliminated as much as possible. Thus, the increase in electric resistance caused by the Al composition-graded layer is suppressed in the Group III nitride semiconductor light-emitting device.

The present techniques, disclosed in the specification, provide a Group III nitride semiconductor light-emitting device exhibiting the improved light extraction efficiency as well as reducing the influence of polarization that a p-type conductivity portion and an n-type conductivity portion occur in the AlGaN layer caused by the Al composition variation, and a production method therefor.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
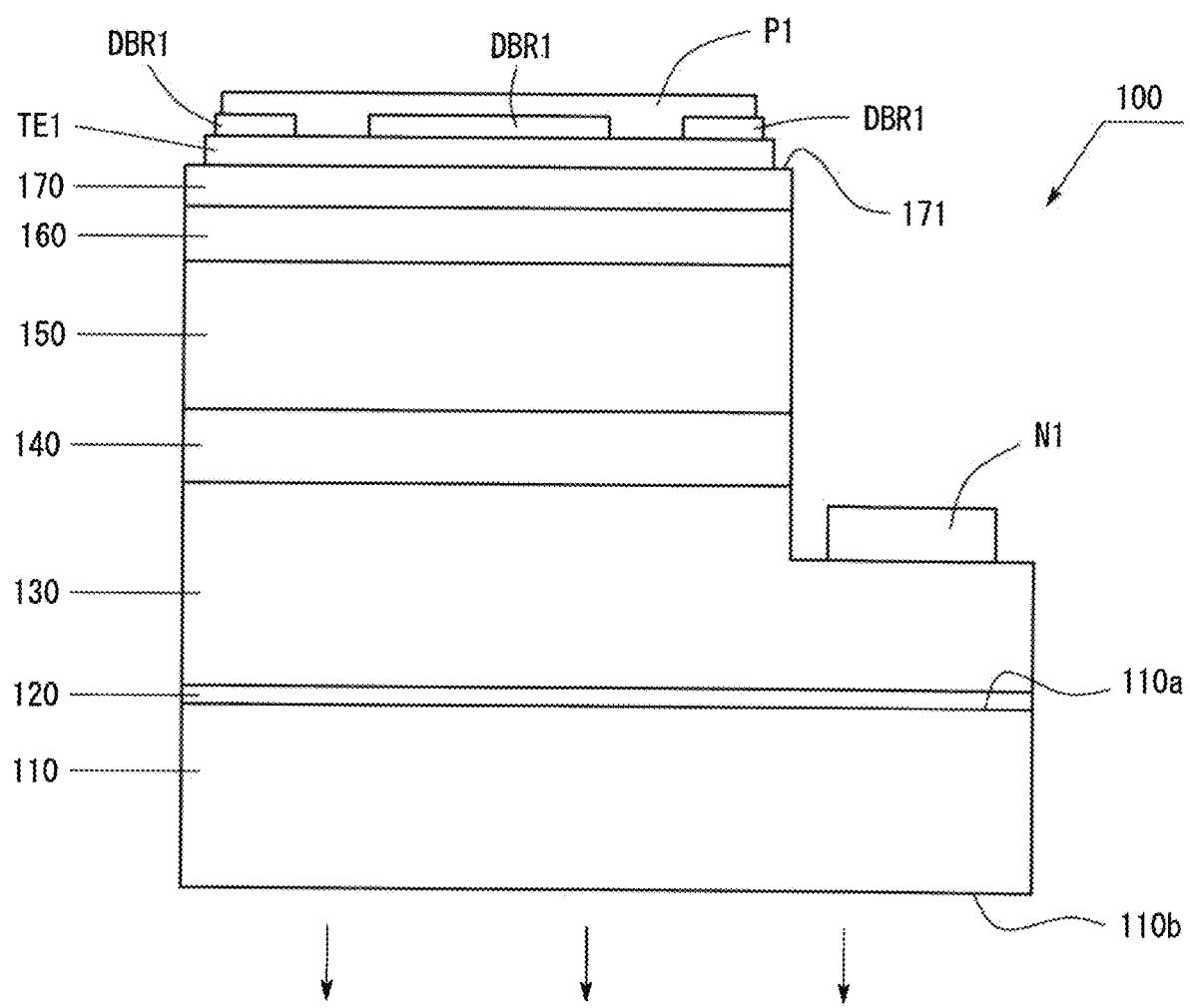
FIG. 1 is a schematic view of the structure of a semiconductor light-emitting device according to the first embodiment.

With reference to the drawings, specific embodiment of the Group III nitride semiconductor light-emitting device and the production method therefor as an example will next be described in detail. However, this embodiment should not be construed as limiting the techniques thereto. The below-described deposition structure of the layers of the semiconductor light-emitting device and the electrode structure are given only for the illustration purpose, and other deposition structures differing therefrom may also be employed. The thickness of each of the layers shown in the drawings is not an actual value, but a conceptual value. In the specification, ultraviolet light refers to a light with a wavelength of 10 nm to 380 nm.

First Embodiment

1. Semiconductor Light-Emitting Device

FIG. 1 shows a schematic view of the structure of a light-emitting device 100 according to the first embodiment. The light-emitting device 100 is a flip-chip type light-emitting device. The light-emitting device 100 has an emission wavelength of 10 nm to 380 nm. The light-emitting device 100 has a plurality of Group III nitride semiconductor layers. As shown in FIG. 1, the light-emitting device 100 includes a substrate 110, a buffer layer 120, an n-type semiconductor layer 130, a light-emitting layer 140, an electron blocking layer 150, a first p-type contact layer 160, a second p-type contact layer 170, a transparent electrode TE1, a distributed bragg reflector DBR1, a p-electrode P1, and an n-electrode N1.

On the first surface 110a of the substrate 110, the buffer layer 120, the n-type semiconductor layer 130, the light-emitting layer 140, the electron blocking layer 150, the first p-type contact layer 160, and the second p-type contact layer 170 are formed in this order. The n-electrode N1 is formed on the n-type semiconductor layer 130. The p-electrode P1 is formed in contact with the transparent electrode TE1.

The n-type semiconductor layer 130 is an n-type semiconductor layer. The n-type semiconductor layer is a first conductivity type first semiconductor layer. The electron blocking layer 150, the first p-type contact layer 160, and the second p-type contact layer 170 are a p-type semiconductor layer. The p-type semiconductor layer is a second conductivity type second semiconductor layer. The n-type semiconductor layer and p-type semiconductor layers may partially include the undoped layer. Thus, the light-emitting device 100 has an n-type semiconductor layer, a light-emitting layer on the n-type semiconductor layer, a p-type semiconductor layer on the light-emitting layer, a transparent electrode TE1 on the p-type semiconductor layer, a p-electrode P1 on the transparent electrode TE1, an n-electrode N1 on the n-type semiconductor layer, a distributed bragg reflector DBR1 on the transparent electrode TE1.

The substrate 110 is a substrate for supporting the semiconductor layers. The substrate 110 has a first surface 110a and a second surface 110b. The first surface 110a of the substrate 110 is a main surface for growing the semiconductor layers. The first surface 110a of the substrate 110 may be flat or may have an uneven shape. The second surface 110b of the substrate 110 is a light extraction surface for extracting light from the light-emitting layer 140 to the outside. The substrate 110 may be made of any other material such as AlGaN, Si, SiC, and ZnO other than sapphire. The substrate 110 may be, needless to say, a growth substrate.

The buffer layer 120 is a layer taking over to some extent the main surface condition of the substrate 110 and serving as a growth nucleus for the n-type semiconductor layer 130. The buffer layer 120 is one of a low temperature growth AlN layer, a high temperature growth AlN layer, or an AlGaN layer. Alternatively, the buffer layer 120 may include a plurality of these layers. The buffer layer 120 may include Group III-V compound other than the above.

The n-type semiconductor layer 130 is, for example, an n-type AlGaN layer doped with Si. The n-type semiconductor layer 130 is formed on the buffer layer 120. That is, the n-type semiconductor layer 130 is disposed above the substrate. The n-type semiconductor layer 130 has an n-type contact layer. The n-type contact layer is in contact with the n-electrode N1. The n-type semiconductor layer 130 may have an n-type AlGaN layer where the Al composition, i.e., AlN mole fraction, is graded in the deposition direction.

The light-emitting layer 140 emits light through recombination of electrons and holes. The light-emitting layer 140 is formed on the n-type semiconductor layer 130. The light-emitting layer 140 has a plurality of barrier layers and well layers. The well layer may be, for example, an AlGaN layer. The barrier layer may be, for example, an AlGaN layer. The barrier layer has an Al composition higher than the Al composition of the well layer. These are only examples, and an AlInGaN layer may be used. The light-emitting layer 140 has a multiquantum well structure. However, the light emitting layer may have a single quantum well structure.

The electron blocking layer 150 is formed on the light-emitting layer 140. The electron blocking layer 150 is a layer for preventing electrons from diffusing to the p-type contact layer 160 side. The electron blocking layer 150 is formed by depositing a plurality of p-type AlGaN layers. The Al composition and the Mg concentration may be different between the first p-type AlGaN layer and the second p-type AlGaN layer. Hereinafter, AlN mole fraction, Al mole fraction, or Al composition ratio in the first p-type AlGaN layer and the second p-type AlGaN layer is referred to as Al composition. The electron blocking layer 150 may have a p-type AlGaN layer where the Al composition is graded in the deposition direction.

The first p-type contact layer 160 is formed on the electron blocking layer 150. The first p-type contact layer 160 is disposed between the second p-type contact layer 170 and the light-emitting layer 140. The first p-type contact layer 160 is in contact with the second p-type contact layer 170. The first p-type contact layer 160 is not in direct contact with the p-electrode P1. The first p-type contact layer 160 is, for example, a p-type AlGaN layer doped with Mg.

The second p-type contact layer 170 is formed on the first p-type contact layer 160. The second p-type contact layer 170 is in contact with the transparent electrode TE1 The second p-type contact layer 170 is electrically connected to the p-electrode P1 via the transparent electrode TE1. The second p-type contact layer 170 is, for example, a p-type AlGaN layer doped with Mg. The second p-type contact layer 170 has a contact surface 171 in contact with the transparent electrode TE1 on the side opposite to the first p-type contact layer 160.

The transparent electrode TE1 is formed on the second p-type contact layer 170. The transparent electrode TE1 is in contact with the contact surface 171 of the second p-type contact layer 170. The transparent electrode TE1 is made of ITO. Other than ITO, transparent conductive oxide such as IZO, ICO, ZnO, $TiO_2$, $NbTiO_2$, and $TaTiO_2$ may be used.

The p-electrode P1 is formed on the transparent electrode TE1. The p-electrode P1 is electrically connected to the second p-type contact layer 170 via the transparent electrode TE1. The p-electrode P1 is a metal electrode made of a metal such as Ni, Au, Ag, Co, and In.

The n-electrode N1 is formed on the n-type semiconductor layer 130. The n-electrode N1 is in contact with the n-type semiconductor layer 130. The n-electrode N1 is a metal electrode made of a metal such as Ni, Au, Ag, Co, and In.

2. First P-Type Contact Layer and Second P-Type Contact Layer

2-1. Al Composition

Figure 2:
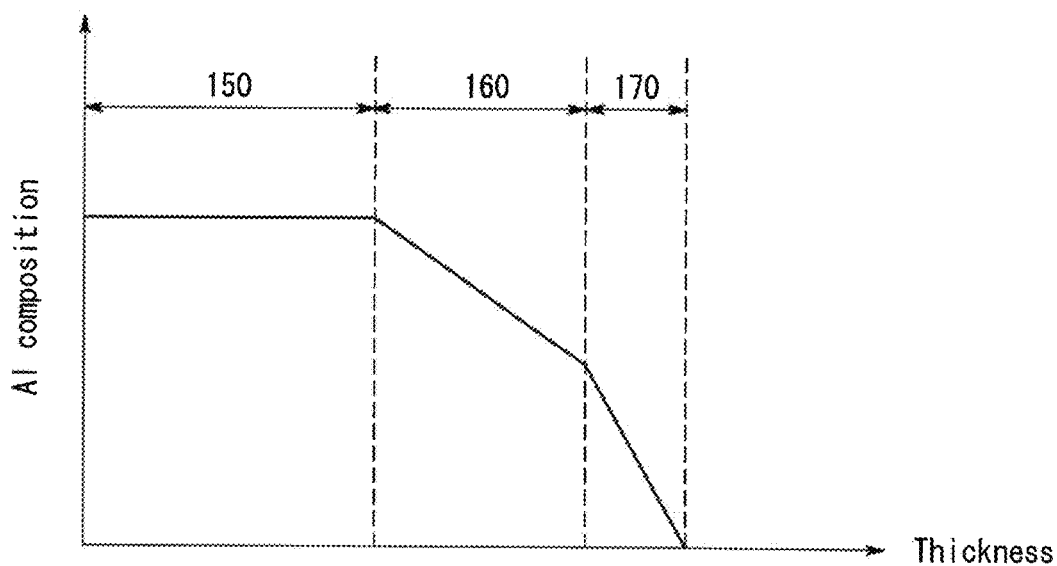
FIG. 2 is a graph showing the relationship between thickness and AlN mole fraction in the p-type semiconductor layers of the semiconductor light-emitting device according to the first embodiment.

FIG. 2 is a graph showing the relationship between thickness and Al composition in the p-type semiconductor layers. In FIG. 2, the horizontal axis represents the thickness from the interface between the light-emitting layer 140 and the electron blocking layer 150 to the interface between the second p-type contact layer 170 and the transparent electrode TE1. In FIG. 2, the vertical axis represents the Al composition.

As shown in FIG. 2, the electron blocking layer 150 has a constant Al composition. The Al composition is preferably is 0.5 to 0.95. In the first p-type contact layer 160, the Al composition is monotonously reduced with distance from the light-emitting layer 140. The reduction rate of the Al composition is almost constant. In the second p-type contact layer 170, the Al composition is monotonously reduced with distance from the light-emitting layer 140. The reduction rate of the Al composition is almost constant. Thus, in the first p-type contact layer 160 and the second p-type contact layer 170, the Al composition varies continuously and monotonously.

As shown in FIG. 2, the Al composition in the second p-type contact layer 170 is lower than the Al composition in the first p-type contact layer 160. The inclination of the Al composition in the second p-type contact layer 170 is larger than the inclination of the Al composition in the first p-type contact layer 160. That is, the decrease amount of the Al composition to the unit thickness in the second p-type contact layer 170 is larger than the decrease amount of the Al composition to the unit thickness in the first p-type contact layer 160. The Al composition variation rate to the unit thickness in the second p-type contact layer 170 is steeper than the Al composition variation rate to the unit thickness in the first p-type contact layer 160. The Al composition variation rate in the first p-type contact layer 160 is preferably $2\times10^{-3}$/nm to $8\times10^{-3}$/nm. The Al composition variation rate in the second p-type contact layer 170 is preferably $8\times10^{-3}$/nm to $8\times10^{-2}$/nm.

As shown in FIG. 2, in the contact surface 171 on the electrode side of the second p-type contact layer 170, the Al composition is 0 to 0.01, preferably, 0.001 or less. That is, the Al composition is almost zero at the contact surface 171.

2-2. Mg Concentration

Figure 3:
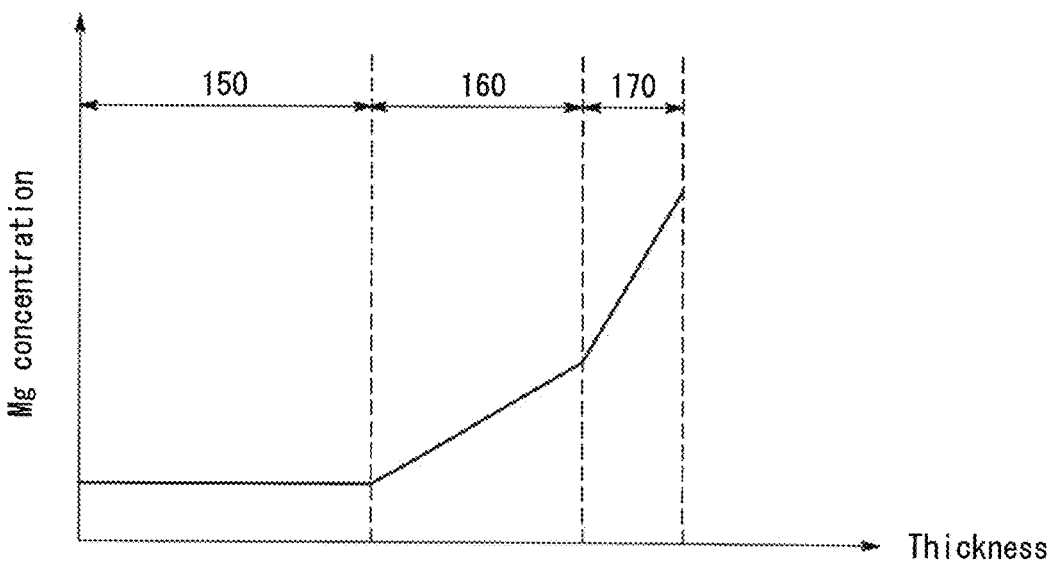
FIG. 3 is a graph showing the relationship between thickness and Mg concentration in the p-type semiconductor layers of the semiconductor light-emitting device according to the first embodiment.

FIG. 3 is a graph showing the relationship between thickness and Mg concentration in the p-type semiconductor layers. In FIG. 3, the horizontal axis represents the thickness from the interface between the light-emitting layer 140 and the electron blocking layer 150 to the interface between the second p-type contact layer 170 and the transparent electrode TE1. In FIG. 3, the vertical axis represents the Mg concentration.

As shown in FIG. 3, the electron blocking layer 150 has a constant Mg concentration. In the first p-type contact layer 160, the Mg concentration is monotonously increased with distance from the light-emitting layer 140. In the second p-type contact layer 170, the Mg concentration is monotonously increased with distance from the light-emitting layer 140. In FIG. 3, the Mg concentration linearly increases, but actually, the Mg concentration increases so as to draw a curve.

As shown in FIG. 3, the Mg doping amount in the second p-type contact layer 170 is larger than the Mg doping amount in the first p-type contact layer 160. The inclination of the Mg concentration in the second p-type contact layer 170 is larger than the inclination of the Mg concentration in the first p-type contact layer 160. That is, the increase amount of Mg concentration to the unit thickness in the second p-type contact layer 170 is larger than the increase amount of Mg concentration to the unit thickness in the first p-type contact layer 160. The Mg doping amount variation rate to the unit thickness in the second p-type contact layer 170 is steeper than the Mg doping amount variation rate to the unit thickness in the first p-type contact layer 160.

2-3. Thickness

The thickness of the second p-type contact layer 170 is smaller than the thickness of the first p-type contact layer 160. The thickness of the first p-type contact layer 160 is 50 nm to 200 nm. The thickness of the second p-type contact layer 170 is 5 nm to 50 nm, preferably, 10 nm to 40 nm, and more preferably, 15 nm to 35 nm.

3. Problems with Composition Grading (Problem with Conventional Structure)

Figure 4:
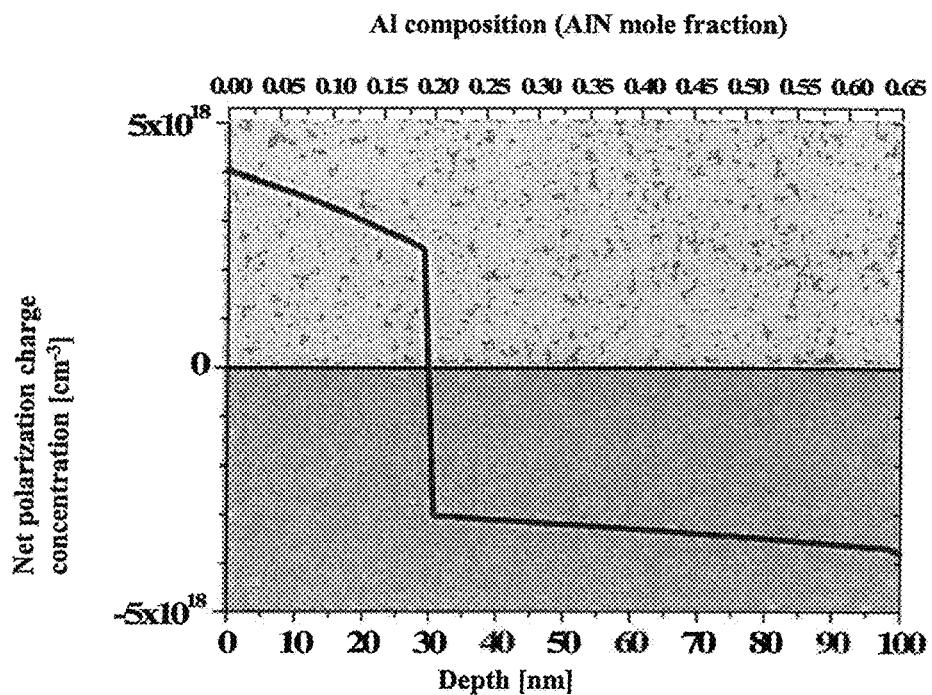
FIG. 4 is a graph showing the net polarization charge concentration when the AlN mole fraction was graded in the AlGaN layer of the semiconductor light-emitting device according to the first embodiment.

FIG. 4 is a graph showing the net polarization charge concentration when the Al composition was graded in an AlGaN layer. In FIG. 4, the horizontal axis represents the depth (nm) from the surface of the AlGaN layer in the thickness direction. In FIG. 4, the vertical axis represents the net polarization charge concentration ($cm^{-3}$). In the upper part of the vertical axis in FIG. 4, the Al compositions (AlN mole fractions) at the respective depths are indicated. That is, FIG. 4 shows the theoretically calculated results for the AlGaN layer (sample) where the Al composition is 0 at a depth of 0 nm, and the Al composition is 0.65 at a depth of 100 nm. This AlGaN layer (sample) is not doped with impurity.

As shown in FIG. 4, positive polarization charge is concentrated in a region having a depth of 0 nm to 30 nm. To counteract the concentration of the positive polarization charge, electrons tend to be concentrated in a region where the depth is 0 nm to 30 nm. That is, in a region having a depth of 0 nm to 30 nm, the AlGaN layer exhibits n-type conductivity.

On the contrary, in a region having a depth of 30 nm to 100 nm, negative polarization charge is concentrated. To counteract the concentration of the negative polarization charge, holes tend to be concentrated in a region having a depth of 30 nm to 100 nm. That is, in a region of a depth of 30 nm to 100 nm, the AlGaN layer exhibits p-type conductivity.

In this way, the AlGaN layer with a graded Al composition is polarized. The degree of polarization is sufficiently large. In some cases, this makes difficult to neutralize n-type conductivity and p-type conductivity by doping impurity. The occurrence of such polarization increases the electric resistance. The light emission efficiency deteriorates as the electric resistance increases.

4. Polarization

The results of polarization study are described below. The positive polarization charge satisfies the following equation.

$$N = x \times 5 \times 10^{13}/d$$

N: positive polarization charge concentration cm$^{-3}$)

x: Al composition difference in Al composition-graded layer (0≤x≤1)

d: thickness of Al composition-graded layer (cm)

The Al composition difference x is a difference between the Al composition of the first surface of the Al composition-graded layer and the Al composition of the second surface of the Al composition-graded layer. For example, when the Al composition of the first surface of the Al composition-graded layer is 0.2, and the Al composition of the second surface of the Al composition-graded layer is 0, the Al composition difference x is 0.2.

For example, when x=0.2, and d=30×10$^{-7}$ cm, N=3.3× 10$^{18}$ cm$^{-3}$. When x=0.5, and d=10×10$^{-7}$ cm, N=2.5×10$^{19}$ cm$^{-3}$. Therefore, the positive polarization charge concentration of the second p-type contact layer 170 is neutralized by adding Mg with the concentration equal to the charge concentration N. And the second p-type contact layer 170 is doped with Mg in the concentration equal to the charge concentration N. Thereby, the second p-type contact layer 170 exhibits a p-type conduction.

In the present embodiment, the Al composition is varied steeply in the second p-type contact layer 170 to increase the hole concentration. The thickness of the second p-type contact layer 170 is reduced to suppress the absorption of light. In this case, the degree of polarization, i.e., the positive polarization charge concentration, is larger than that in the conventional light-emitting device. Therefore, the Mg doping concentration must be remarkably increased, for example, twice or more the normal Mg doping concentration.

5. Effect of the Embodiment 5-1. Increase of Hole Concentration

In the light-emitting device 100 of the embodiment, the p-type contact layer has two layers of a first p-type contact layer 160 and a second p-type contact layer 170. In the first p-type contact layer 160 and the second p-type contact layer 170, the Al composition is reduced with distance from the light-emitting layer 140. Thereby, the hole concentration increases (refer to paragraphs 0025 to 0028, and FIG. 4 of Patent Document 1).

5-2. Elimination of Influence of Polarization (Suppression of Increase in Electric Resistance)

The thickness of the second p-type contact layer 170 is rendered smaller than the thickness of the first p-type contact layer 160. The Al composition variation rate to the unit thickness in the second p-type contact layer 170 is higher than the Al composition variation rate to the unit thickness in the first p-type contact layer 160. Therefore, the n-type conductivity portion (electron concentration region) in the p-type contact layer can be minimized as small as possible. That is, the influence of polarization caused by the Al composition-graded layer with a monotonously decreasing Al composition can be eliminated. Thereby, in the light-emitting device 100 of the embodiment, the increase in electric resistance caused by the Al composition-graded layer is suppressed.

A degree of N-type conductivity can be suitably suppressed by doping the second p-type contact layer 170 with Mg. Particularly, in the second p-type contact layer 170, the Mg concentration steeply increases closer to the contact surface 171 on the electrode side. Thereby, the n-type conductivity region in the p-type contact layer can exhibit p-type conductivity. Therefore, the influence of polarization caused by the Al composition-graded layer with a monotonously decreasing Al composition can be eliminated as much as possible.

5-3. Lattice Relaxation and Hole Concentration

The Al composition is 0 to 0.2 on the contact surface 171 side of the second p-type contact layer 170. In a region with an Al composition ranging from 0 to 0.2 of the Al composition-graded layer, lattice relaxation occurs (FIG. 5(a) of Non-Patent Document 1). More holes can be generated in the region where lattice relaxation occurs, by increasing the Mg doping concentration as the Al composition decreases.

5-4. Suppression of Absorption of Ultraviolet Light

The first p-type contact layer 160 and the second p-type contact layer 170 are both a p-type AlGaN layer. The light-emitting device 100 does not have a GaN layer. The thickness of the AlGaN layer with a low Al composition is sufficiently small. Therefore, the semiconductor layers of the light-emitting device 100 do not absorb ultraviolet light that much.

5-5. Contact Resistance of P-Type Contact Layer

The Al composition is almost zero in the contact surface 171 of the second p-type contact layer 170. Therefore, the second p-type contact layer 170 is suitably in ohmic contact with the transparent electrode TE1.

6. Method for Producing Semiconductor Light-Emitting Device

The production method includes the steps of forming an n-type semiconductor layer on a substrate, forming a light-emitting layer on the n-type semiconductor layer, and forming a p-type semiconductor layer on the light-emitting layer. The p-type semiconductor layer formation step includes the steps of forming a first p-type contact layer from the light-emitting layer side, and forming a second p-type contact layer on the first p-type contact layer.

Examples of the carrier gas employed include hydrogen (H$_2$), nitrogen (N$_2$), and a mixture of hydrogen and nitrogen (H$_2$+N$_2$). In the steps being described later, unless otherwise specified, any of these may be employed. Ammonia gas (NH$_3$) is used as a nitrogen source. Trimethylgallium (Ga(CH$_3$)$_3$: "TMG") as a gallium source. Trimethylaluminum (Al(CH$_3$)$_3$: "TMA") is used as an aluminum source. Silane (SiH$_4$) is used as an n-type dopant gas, and biscyclopentadienylmagnesium (Mg(C$_5$H$_5$)$_2$) is used as a p-type dopant gas.

6-1. Substrate Preparation Step

Firstly, a substrate 110 is prepared. For example, the substrate 110 is disposed on a susceptor in a chamber of a MOCVD furnace.

6-2. Substrate Washing Step

Subsequently, the substrate temperature is heated up to a temperature of 1,000° C. or more. Hydrogen gas is supplied into the chamber. Thereby, the main surface of the substrate 110 is washed and reduced.

6-3. Buffer Layer Formation Step

Subsequently, a buffer layer 120 is formed on the substrate 110. The buffer layer 120 is, for example, one of a low-temperature growth AlN layer, a high-temperature growth AlN layer, and an AlGaN layer. Alternatively, the buffer layer 120 may include a plurality of these layers. The buffer layer 120 may include Group III-V compound other than the above.

6-4. N-Type Semiconductor Layer Formation Step

An n-type semiconductor layer 130 is formed on the buffer layer 120. The substrate temperature in this process is within a range of 900° C. to 1,200° C. In this process, the n-type contact layer is formed. An Al composition-graded layer having different Al compositions from the substrate 110 to the light-emitting layer 140 may be formed.

6-5. Light-Emitting Layer Formation Step

A light-emitting layer 140 is formed by alternately depositing a well layer and a barrier layer on the n-type semiconductor layer 130. That is, the light-emitting layer formation step includes a barrier layer formation step of forming a plurality of barrier layers, and a well layer formation step of forming a plurality of well layers. The substrate temperature is within a range of 900° C. to 1,200° C.

6-6. Electron Blocking Layer Formation Step

An electron blocking layer 150 is formed on the barrier layer of the light-emitting layer 140. The electron blocking layer 150 is, for example, a p-type AlGaN layer. The substrate temperature is within a range of 900° C. to 1,200° C.

6-7. First P-Type Contact Layer Formation Step

A first p-type contact layer 160 is formed on the electron blocking layer 150. The first p-type contact layer 160 is a p-type AlGaN layer. In forming the p-type AlGaN layer, the TMA supply amount is decreased toward the upper layers. That is, in the first p-type contact layer 160, the Al composition is decreased with distance from the light-emitting layer 140. The TMG supply amount is preferably increased with the decrease of the TMA supply amount.

The supply amount of bis(cyclopentadienyl)magnesium $(Mg(C_5H_5)_2)$ as a p-type dopant gas is increased toward the upper layers. The substrate temperature is within a range of 800° C. to 1,200° C.

6-8. Second P-Type Contact Layer Formation Step

A second p-type contact layer 170 is formed on the first p-type contact layer 160. The second p-type contact layer 170 is a p-type AlGaN layer. In forming the p-type AlGaN layer, the TMA supply amount is decreased toward the upper layers. That is, in the second p-type contact layer 170, the Al composition is decreased with distance from the light-emitting layer. The TMG supply amount is preferably increased with the decrease of the TMA supply amount.

The Al composition in the second p-type contact layer 170 is rendered lower than the minimum vale of the Al composition in the first p-type contact layer 160. The Al composition variation rate to the unit thickness in the second p-type contact layer 170 is rendered higher than the Al composition variation rate to the unit thickness in the first p-type contact layer 160. That is, the decrease rate of the TMA supply amount per unit hour in forming the second p-type contact layer 170 is higher than the decrease rate of the TMA supply amount per unit hour in forming the first p-type contact layer 160.

The supply amount of bis(cyclopentadienyl)magnesium $(Mg(C_5H_5)_2)$ as a p-type dopant gas is increased toward the upper layers. At least hydrogen gas may be supplied as a carrier gas. Thereby, the surface flatness of the second p-type contact layer 170 is improved. The substrate temperature is within a range of 800° C. to 1,200° C.

6-9. Transparent Electrode Formation Step

A transparent electrode TE1 is formed on the second p-type contact layer 170. The technique of formation may be sputtering or vapor deposition.

6-10. Electrode Formation Step

The semiconductor layers are partially removed through laser radiation or etching from the second p-type contact layer 170 side, to thereby expose a part of the n-type semiconductor layer 130. Then, an n-electrode N1 is formed on the thus-exposed region. A distributed bragg reflector DBR1 with repeated pairs of $SiO_2$ and $TiO_2$ films is formed on the transparent electrode TE1. Parts of the distributed bragg reflector DBR1 are etched to make windows. A p-electrode P1 is formed on the distributed bragg reflector DBR1 to be contacted with the transparent electrode TE1 via the windows. Either of the p-electrode P1 formation step and the n-electrode N1 formation step may be performed first.

6-11. Other Steps

In addition to the aforementioned steps, additional steps such as a step of covering an element with an insulating film and a heat treatment step may be carried out. In this way, the light-emitting device 100 shown in FIG. 1 is produced.

7. Experiments

7-1. Structure of Example

Figure 5:
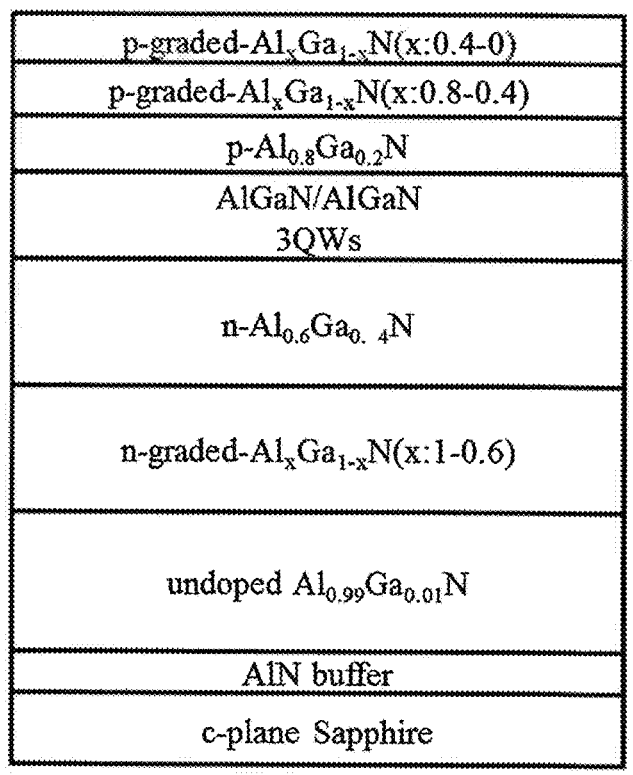
FIG. 5 shows the deposition structure of a light-emitting device in Example.

FIG. 5 shows the deposition structure of a light-emitting device of Example. As shown in FIG. 5, the light-emitting device of Example has a structure in which a c-plane sapphire substrate, an AlN buffer layer, an undoped $Al_{0.99}Ga_{0.01}N$ layer, an n-type graded $Al_xGa_{1-x}N$ layer, an n-type $Al_{0.6}Ga_{0.4}N$ layer, an AlGaN light-emitting layer, a p-type $A_{0.8}Ga_{0.2}N$ layer, a first p-type graded $Al_xGa_{1-x}N$ layer, and a second p-type graded $Al_xGa_{1-x}N$ layer are sequentially deposited.

The Al composition of the n-type graded $Al_xGa_{1-x}N$ layer monotonously decreases from 1 to 0.6 from the undoped $A_{0.99}Ga_{0.01}N$ layer to the n-type $Al_{0.6}Ga_{0.4}N$ layer.

The AlGaN light-emitting layer has an AlGaN well layer and an AlGaN barrier layer. The Al composition of the barrier layer is higher than the Al composition of the well layer. The well layer has three layers.

The first p-type graded $Al_xGa_{1-x}N$ layer corresponds to the first p-type contact layer 160. The Al composition of the first p-type graded $Al_xGa_{1-x}N$ layer monotonously decreases from 0.8 to 0.4 from the p-type $Al_{0.8}Ga_{0.2}N$ layer to the second p-type graded $Al_xGa_{1-x}N$ layer. The first p-type graded $Al_xGa_{1-x}N$ layer has a thickness of 100 nm.

The second p-type graded $Al_xGa_{1-x}N$ layer corresponds to the second p-type contact layer 170. The Al composition of the second p-type graded $Al_xGa_{1-x}N$ layer is monotonously reduced from 0.4 to 0 with distance from the first p-type graded $Al_xGa_{1-x}N$ layer. The second p-type graded $Al_xGa_{1-x}N$ layer has a thickness of 30 nm.

7-2. Structure of Comparative Example

Figure 6:
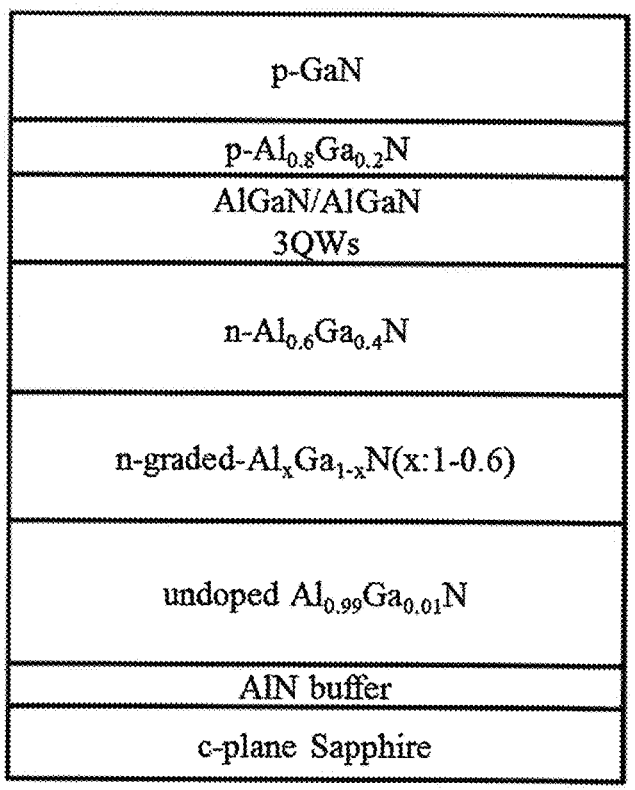
FIG. 6 shows the deposition structure of a light-emitting device in Comparative Example.

FIG. 6 shows the deposition structure of the light-emitting device of Comparative Example. Only the p-type contact layer is different between the light-emitting device of Comparative Example in FIG. 6 and the light-emitting device of Example in FIG. 5. In the light-emitting device of Comparative Example, the p-type contact layer is a single p-type GaN layer.

7-3. Current Dependency of Light Output

Figure 7:
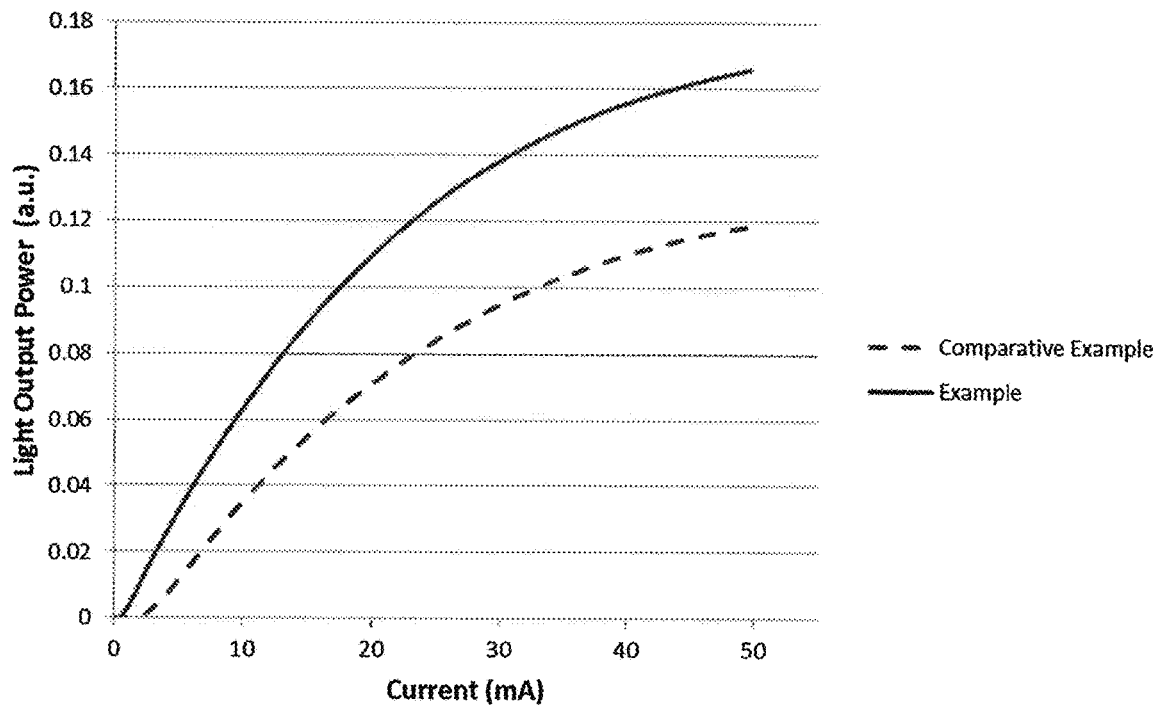
FIG. 7 is a graph showing the relationship between current flowing in the light-emitting device and light output.

FIG. 7 is a graph showing the relationship between current flowing in the light-emitting device and light output. In FIG. 7, the horizontal axis represents the current (mA) flowing in the light-emitting device. In FIG. 7, the vertical axis represents the light output (a.u.) of the light-emitting device. As shown in FIG. 7, at the current value equal to or less than 50 mA, the light output of the light-emitting device of Example is larger than the light output of the light-emitting device of Comparative Example.

Figure 8:
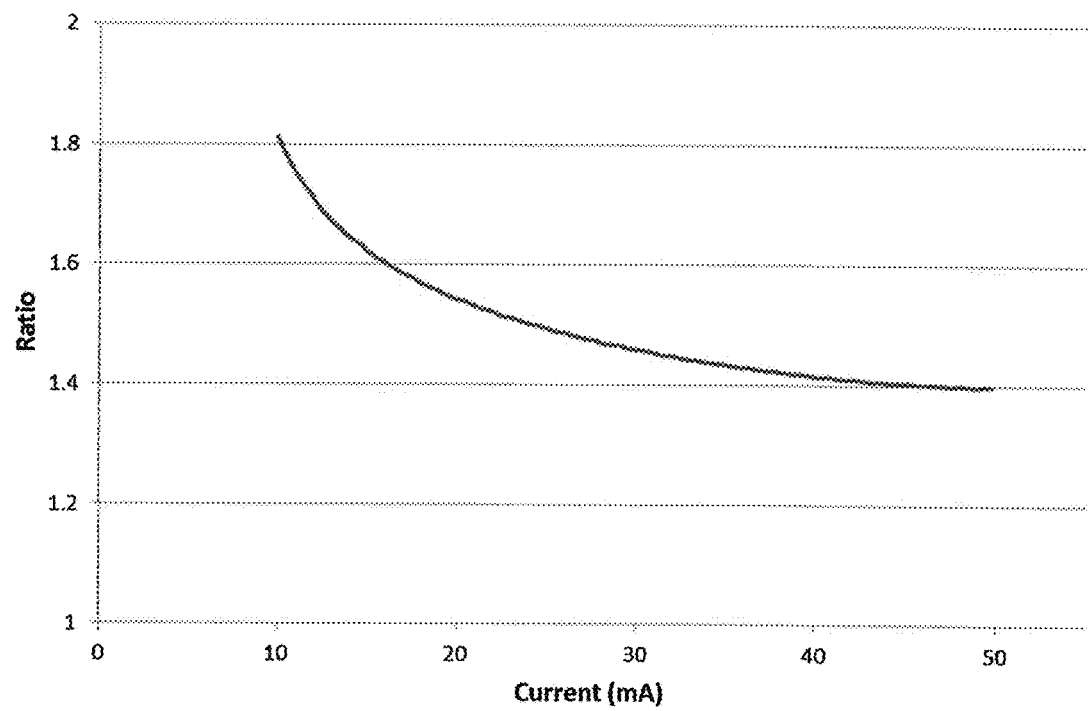
FIG. 8 is a graph showing the ratio of the light output of the light-emitting device of Example to the light output of the light-emitting device of Comparative Example.

FIG. 8 is a graph showing the ratio of the light output of the light-emitting device of Example to the light output of the light-emitting device of Comparative Example. In FIG. 8, the horizontal axis represents the current (mA) flowing in the light-emitting device. In FIG. 8, the vertical axis represents the ratio of the light output of the light-emitting device of Example to the light output of the light-emitting device of Comparative Example. In FIG. 8, plotting is omitted in a region where the current is equal to or less than 10 mA. As shown in FIG. 8, at the current value from 10 mA to 50 mA, the brightness of the light-emitting device of Example is 1.4 times the brightness of the light-emitting device of Comparative Example. When the current value is 10 mA, the brightness of the light-emitting device of Example is approximately 1.8 times the brightness of the light-emitting device of Comparative Example.

Thus, the light output of the light-emitting device of Example is sufficiently larger than the light output of the light-emitting device of Comparative Example.

7-4. Wavelength Dependency of Transmittance

The structure of Example shown in FIG. 5 is irradiated with lights having different wavelengths, and the transmittances of the lights were measured. For that purpose, samples were produced, in which the thicknesses of the second p-type graded $Al_xGa_{1-x}N$ layer are 0 nm, 25 nm, 50 nm, and 100 nm. Hereinafter, 0 nm refers to the sample in which the second p-type graded $Al_xGa_{1-x}N$ layer was not formed. The Al composition in the surface (on which the transparent electrode is formed) of the second p-type graded $Al_xGa_{1-x}N$ layer is 0. The Al composition at the interface between the first p-type graded $Al_xGa_{1-x}N$ layer and the second p-type graded $Al_xGa_{1-x}N$ layer is 0.4.

Figure 9:
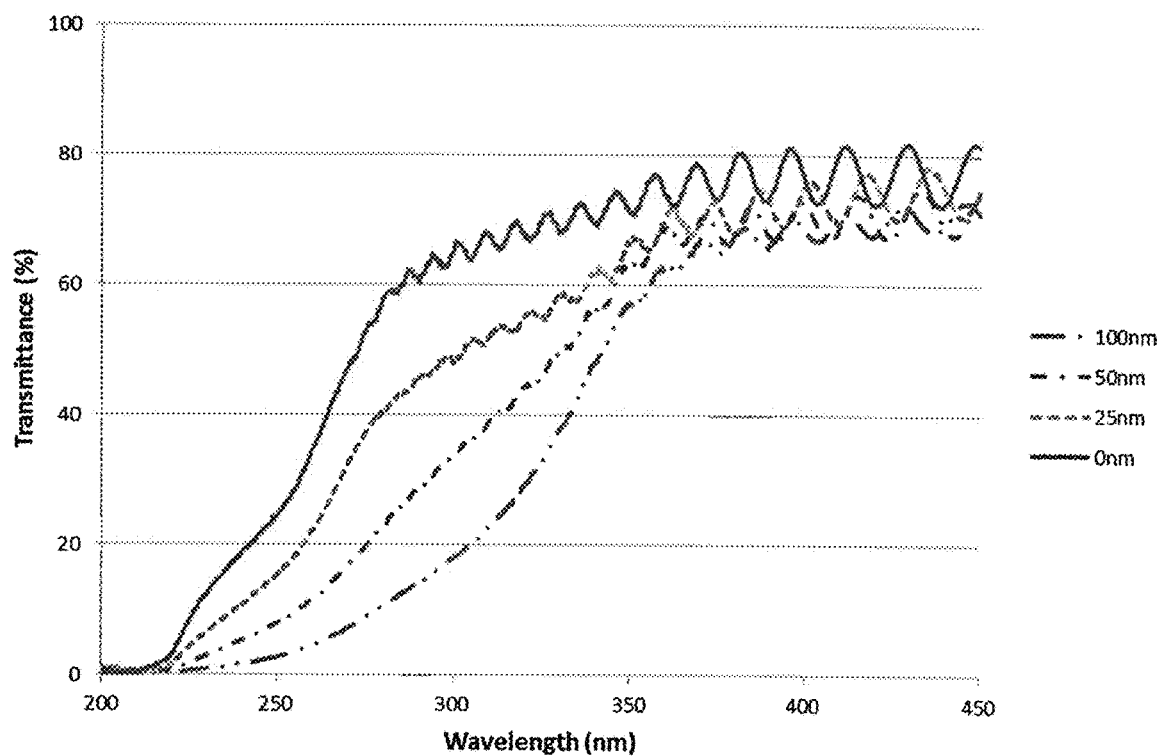
FIG. 9 is a graph showing the relationship between thickness and light transmittance of the second p-type graded $Al_xGa_{1-x}N$ layer.

FIG. 9 is a graph showing the relationship between an optical light transmittance of the light-emitting diode with the structure of FIG. 5 and a wavelength when the thickness of the second p-type graded $Al_xGa_{1-x}N$ layer is a parameter. In FIG. 9, the horizontal axis represents the optical wavelength. In FIG. 9, the vertical axis represents the optical transmittance. The cases where the thicknesses of the second p-type graded $Al_xGa_{1-x}N$ layer are 0 nm, 25 nm, 50 nm, and 100 nm are shown by a solid line, a dashed line, an alternate long and short dashed line, and an alternate long and two short dashed line, respectively.

As shown in FIG. 9, there is a tendency that the larger the thickness of the second p-type graded $Al_xGa_{1-x}N$ layer, the lower the light transmittance. For example, the case where the wavelength is 300 nm will be described. When the thickness of the second p-type graded $Al_xGa_{1-x}N$ layer is 0 nm, the optical transmittance is approximately 65%. When the thickness of the second p-type graded $Al_xGa_{1-x}N$ layer is 25 nm, the optical transmittance is approximately 48%. When the thickness of the second p-type graded $Al_xGa_{1-x}N$ layer is 50 nm, the light transmittance is approximately 33%. When the thickness of the second p-type graded $Al_xGa_{1-x}N$ layer is 100 nm, the optical transmittance is approximately 18%.

When the thickness of the second p-type graded $Al_xGa_{1-x}N$ layer is 0 nm, the first p-type graded $Al_xGa_{1-x}N$ layer has a contact surface in contact with the transparent electrode. The Al composition of the contact surface in the first p-type graded $Al_xGa_{1-x}N$ layer is 0.4. Therefore, the first p-type graded $Al_xGa_{1-x}N$ layer hardly obtains suitable Ohmic contact with the transparent electrode. Thus, the thickness of the second p-type graded $Al_xGa_{1-x}N$ layer is preferably 5 nm to 50 nm.

8. Variations 8-1. Face-Up Type Light-Emitting Device

The light-emitting device 100 of the embodiment is a flip-chip type semiconductor light-emitting device. However, alternatively, the present techniques may also be applied to a face-up type semiconductor light-emitting device.

8-2. N-Type Semiconductor Layer

The n-type semiconductor layer may have any deposition structure other than the structure of the above embodiment. For example, the n-type semiconductor layer 130 may include an undoped semiconductor layer or an Al composition-graded layer.

8-3. P-Type Semiconductor Layer

The p-type semiconductor layer may have any deposition structure other than the structure of the above embodiment. For example, the p-type semiconductor layer may include an undoped semiconductor layer or an Al composition-graded layer.

8-4. Reflective Layer

In the light-emitting device 100, the distributed bragg reflector DBR1 and the p-electrode P1 reflect light emitted from the light-emitting layer 140 to the light extraction surface side. However, the light-emitting device may have a reflective layer other than the above.

8-5. Combinations

The aforementioned variations may be combined with one another without any restriction.

9. Summary of the Embodiment

As described above, the light-emitting device 100 of the embodiment has the first p-type contact layer 160 and the second p-type contact layer 170. In the first p-type contact layer 160 and the second p-type contact layer 170, the Al composition is reduced with distance from the light-emitting layer 140. Thereby, the hole concentration increases. The thickness of the second p-type contact layer 170 is smaller than the thickness of the first p-type contact layer 160, and the composition variation rate of the second p-type contact layer 170 is steeper. Therefore, the influence of polarization caused by the Al composition-graded layer can be eliminated as much as possible.

A. Note

In a first aspect of the present techniques, there is provided a Group III nitride semiconductor light-emitting device including a substrate, an n-type semiconductor layer on the substrate, a light-emitting layer on the n-type semiconductor layer, and a p-type semiconductor layer on the light-emitting layer. The Group III nitride semiconductor light-emitting device has an emission wavelength of 380 nm or less. The p-type semiconductor layer has a first p-type contact layer and a second p-type contact layer. The first p-type contact layer is disposed between the second p-type contact layer and the light-emitting layer. The first p-type contact layer is a p-type AlGaN layer. The second p-type contact layer is a p-type AlGaN layer. The Al composition in the first p-type contact layer is reduced with distance from the light-emitting layer. The Al composition in the second p-type contact layer is reduced with distance from the light-emitting layer. The Al composition in the second p-type contact layer is lower than the Al composition in the first p-type contact layer. The Al composition variation rate to the unit thickness in the second p-type contact layer is higher than the Al composition variation rate to the unit thickness in the first p-type contact layer.

A second aspect of the present techniques is drawn to a specific embodiment of the Group III nitride semiconductor light-emitting device, wherein the Mg doping amount in the first p-type contact layer is increased with distance from the light-emitting layer. The Mg doping amount in the second p-type contact layer is increased with distance from the light-emitting layer. The Mg doping amount in the second p-type contact layer is larger than the Mg doping amount in the first p-type contact layer. The Mg doping amount variation rate to the unit thickness in the second p-type contact layer is higher than the Mg doping amount variation rate to the unit thickness in the first p-type contact layer.

A third aspect of the present techniques is drawn to a specific embodiment of the Group III nitride semiconductor light-emitting device, wherein the thickness of the second p-type contact layer is smaller than the thickness of the first p-type contact layer. Since the thickness of the second p-type contact layer easy to absorb light is comparatively small, the light extraction efficiency is high.

A fourth aspect of the present techniques is drawn to a specific embodiment of the Group III nitride semiconductor light-emitting device, wherein the thickness of the second p-type contact layer is 5 nm to 50 nm. When the thickness of the second p-type contact layer easy to absorb light is within this range, the light extraction efficiency is high.

A fifth aspect of the present techniques is drawn to a specific embodiment of the Group III nitride semiconductor light-emitting device, wherein the second p-type contact layer has a transparent electrode thereon. The second p-type contact layer has a contact surface in contact with the transparent electrode on the side opposite to the first p-type contact layer. The Al composition in the contact surface is 0 to 0.01.

In a sixth aspect of the present techniques, there is provided a method for producing a Group III nitride semiconductor light-emitting device, the method including the steps of forming an n-type semiconductor layer on a substrate, forming a light-emitting layer on the n-type semiconductor layer, and forming a p-type semiconductor layer on the light-emitting layer. The Group III nitride semiconductor light-emitting device has an emission wavelength of 380 nm or less. The p-type semiconductor layer formation step includes the steps of forming a first p-type contact layer from the light-emitting layer side, and forming a second p-type contact layer on the first p-type contact layer. In the first p-type contact layer formation step, a p-type AlGaN layer is formed as the first p-type contact layer, and the Al composition in the first p-type contact layer is reduced with distance from the light-emitting layer. In the second p-type contact layer formation step, a p-type AlGaN layer is formed as the second p-type contact layer, and the Al composition in the second p-type contact layer is reduced with distance from the light-emitting layer. The Al composition in the second p-type contact layer is lower than the Al composition in the first p-type contact layer, and the Al composition variation rate to the unit thickness in the second p-type contact layer is higher than the Al composition variation rate to the unit thickness in the first p-type contact layer.

What is claimed is:

1. A Group III nitride semiconductor light-emitting devices comprising:
    a substrate;
    an n-type semiconductor layer on the substrate;
    a light-emitting layer on the n-type semiconductor layer; and
    a p-type semiconductor layer on the light-emitting layer, wherein
    an emission wavelength is at least one wavelength selected from 380 nm to 10 nm;
    the p-type semiconductor layer has a first p-type contact layer and a second p-type contact layer;
    the first p-type contact layer is disposed between the second p-type contact layer and the light-emitting layer;
    the first p-type contact layer is a p-type AlGaN layer;
    the second p-type contact layer is a p-type AlGaN layer;
    Al composition in the first p-type contact layer is continuously and monotonously decreased with distance from the light-emitting layer;
    Al composition in the second p-type contact layer is continuously and monotonously decreased from value of Al composition at an interface between the first p-type contact layer and the second p-type contact layer with distance from the first p-type contact layer; and
    absolute value of Al composition decrease rate at any position in the second p-type contact layer is larger than absolute value of Al composition decrease rate at any position in the first p-type contact layer.

2. The Group III nitride semiconductor light-emitting device according to claim 1, wherein
    Mg doping concentration in the first p-type contact layer is continuously and monotonously increased with distance from the light-emitting layer;
    Mg doping concentration in the second p-type contact layer is continuously and monotonously increased from value of Mg doping concentration at an interface between the first p-type contact layer and the second p-type contact layer with distance from the first p-type contact layer; and
    Mg doping concentration increase rate at any position in the second p-type contact layer is larger than an Mg doping concentration increase rate at any position in the first p-type contact layer.

3. The Group III nitride semiconductor light-emitting device according to claim 2, wherein a thickness of the second p-type contact layer is smaller than a thickness of the first p-type contact layer.

4. The Group III nitride semiconductor light-emitting device according to claim 2, wherein a thickness of the second p-type contact layer is any value in a range from 5 nm to 50 nm.

5. The Group III nitride semiconductor light-emitting device according to claim 2, wherein the device further comprises a transparent electrode on the second p-type contact layer,
    wherein the second p-type contact layer has a contact surface in contact with the transparent electrode, and wherein the Al composition in the contact surface is 0 to 0.01.

6. The Group III nitride semiconductor light-emitting device according to claim 2, wherein the absolute value of Al composition decrease rate in the first p-type contact layer is any value selected in a range from $2\times10^{-3}$/nm to $8\times10^{-3}$/nm, and the absolute value of Al composition decrease rate in the second p-type contact layer is any value selected in a range from $8\times10^{-3}$/nm to $8\times10^{-2}$/nm.

7. The Group III nitride semiconductor light-emitting device according to claim 1, wherein a thickness of the second p-type contact layer is smaller than a thickness of the first p-type contact layer.

8. The Group III nitride semiconductor light-emitting device according to claim 7, wherein the thickness of the second p-type contact layer is any value in a range from 5 nm to 50 nm.

9. The Group III nitride semiconductor light-emitting device according to claim 7, wherein the device further comprises a transparent electrode on the second p-type contact layer,
wherein the second p-type contact layer has a contact surface in contact with the transparent electrode, and
wherein the Al composition in the contact surface is 0 to 0.01.

10. The Group III nitride semiconductor light-emitting device according to claim 1, wherein a thickness of the second p-type contact layer is any value within a range from 5 nm to 50 nm.

11. The Group III nitride semiconductor light-emitting device according to claim 10, wherein the device further comprises a transparent electrode on the second p-type contact layer,
wherein the second p-type contact layer has a contact surface in contact with the transparent electrode, and
wherein the Al composition in the contact surface is 0 to 0.01.

12. The Group III nitride semiconductor light-emitting device according to claim 1, wherein the device further comprises a transparent electrode on the second p-type contact layer,
wherein the second p-type contact layer has a contact surface in contact with the transparent electrode, and
wherein the Al composition in the contact surface is 0 to 0.01.

13. The Group III nitride semiconductor light-emitting device according to claim 1, wherein the absolute value of Al composition decrease rate in the first p-type contact layer is any value selected in a range from $2\times10^{-3}$/nm to $8\times10^{-3}$/nm.

14. The Group III nitride semiconductor light-emitting device according to claim 13, wherein the absolute value of Al composition decrease rate in the second p-type contact layer is any value selected in a range from $8\times10^{-3}$/nm to $8\times10^{-2}$/nm.

15. The Group III nitride semiconductor light-emitting device according to claim 1, wherein the absolute value of Al composition decrease rate in the second p-type contact layer is any value selected in a range from $8\times10^{-3}$/nm to $8\times10^{-2}$/nm.

* * * * *